(12) United States Patent
Song

(10) Patent No.: US 9,537,477 B2
(45) Date of Patent: Jan. 3, 2017

(54) SEMICONDUCTOR APPARATUS CAPABLE OF CONVERTING A FREQUENCY OF AN INPUT CLOCK

(71) Applicant: SK hynix Inc., Icheon-si Gyeonggi-do (KR)

(72) Inventor: Choung Ki Song, Icheon-si (KR)

(73) Assignee: SK Hynix Inc., Icheon-si (KR)

( * ) Notice: Subject to any disclaimer, the term of this patent is extended or adjusted under 35 U.S.C. 154(b) by 0 days.

(21) Appl. No.: 14/689,433

(22) Filed: Apr. 17, 2015

(65) Prior Publication Data

US 2016/0182031 A1    Jun. 23, 2016

(30) Foreign Application Priority Data

Dec. 22, 2014    (KR) .................. 10-2014-0186127

(51) Int. Cl.
*H03K 7/06* (2006.01)
(52) U.S. Cl.
CPC .................... *H03K 7/06* (2013.01)

(58) Field of Classification Search
CPC ......... G06F 7/68; H03K 5/156; H03K 5/0006; H03K 7/06; H03B 19/00; H03B 19/06; H03B 19/10; H03B 19/14
USPC .................. 327/113, 115, 116, 118, 119
See application file for complete search history.

(56) References Cited

U.S. PATENT DOCUMENTS

2014/0035650 A1* 2/2014 Zerbe .................. H03L 7/06
327/299

FOREIGN PATENT DOCUMENTS

KR    1019980056142 A    9/1998

* cited by examiner

*Primary Examiner* — John Poos
(74) *Attorney, Agent, or Firm* — William Park & Associates Ltd.

(57) ABSTRACT

A semiconductor apparatus includes a multiplication control block configured to generate a plurality of frequency control signals according to an input clock and a multiplication determination signal; and a clock output block configured to generate an output clock according to the input clock, the multiplication determination signal and the plurality of frequency control signals.

18 Claims, 4 Drawing Sheets

SEMICONDUCTOR APPARATUS CAPABLE OF CONVERTING A FREQUENCY OF AN INPUT CLOCK

CROSS-REFERENCES TO RELATED APPLICATION

The present application claims priority under 35 U.S.C. §119(a) to Korean application number 10-2014-0186127, filed on Dec. 22, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

As the operation speed of a semiconductor apparatus increases, design is made such that signals may be inputted to and outputted from a semiconductor apparatus in synchronization with a clock.

As a semiconductor apparatus has a higher operation speed, signals are inputted to and outputted from the semiconductor apparatus in synchronization with a clock having a higher frequency. However, in a semiconductor apparatus having a higher operation speed, power consumption may markedly increase, and it may be necessary to slow down the operation speed according to a user or the operational circumstances of the semiconductor apparatus.

A semiconductor apparatus capable of performing both a high speed operation and a low speed operation needs a circuit for converting a clock of a high frequency into a clock with a low frequency. Also, when frequency conversion is performed, there should be no phase difference between a clock before conversion and a clock after conversion.

SUMMARY

In an embodiment, a semiconductor apparatus includes a multiplication control block configured to generate a plurality of frequency control signals according to an input clock and a multiplication determination signal. The semiconductor apparatus also includes a clock output block configured to generate an output clock according to the input clock, the multiplication determination signal and the plurality of frequency control signals.

In an embodiment, a semiconductor apparatus includes a multiplication control block configured to generate first to third frequency control signals according to a multiplication determination signal and initialize the first to third frequency control signals according to a synchronization reset signal and an asynchronization reset signal. The semiconductor apparatus also includes a clock output block configured to output an output clock according to the multiplication determination signal and the first to third frequency control signals.

In an embodiment, a semiconductor apparatus includes a multiplication control block configured to generate first to third frequency control signals according to an input clock to allow a frequency of the input clock to be changed when a multiplication determination signal is enabled and fix the first to third frequency control signals to specified levels when the multiplication determination signal is disabled. The semiconductor apparatus also includes a clock output block configured to output an output clock by changing the frequency of the input clock according to the multiplication determination signal and the first to third frequency control signals.

DETAILED DESCRIPTION

Hereinafter, a semiconductor apparatus will be described below with reference to the accompanying figures through various embodiments.

Figure 1:
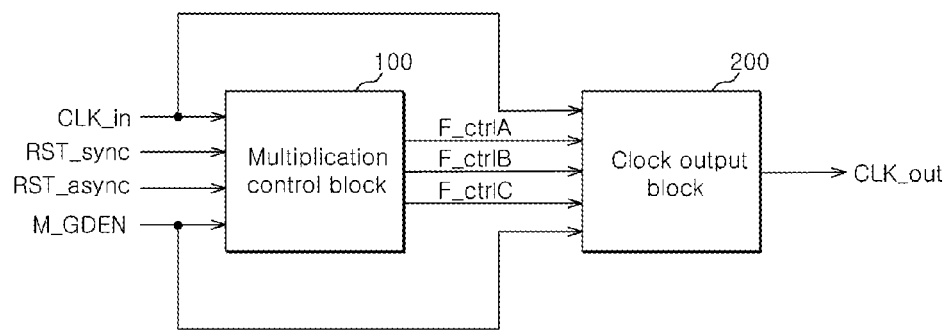
FIG. 1 is a configuration diagram illustrating a representation of an example of a semiconductor apparatus in accordance with an embodiment.

Referring to FIG. 1, a semiconductor apparatus in accordance with an embodiment includes a multiplication control block 100 and a clock output block 200.

The multiplication control block 100 generates first to third frequency control signals F_ctrlA, F_ctrlB and F_ctrlC according to a multiplication determination signal M_GDEN. The multiplication control block 100 initializes the first to third frequency control signals F_ctrlA, F_ctrlB and F_ctrlC in response to a synchronization reset signal RST_sync and an asynchronization reset signal RST_async. For example, the multiplication control block 100 generates the first to third frequency control signals F_ctrlA, F_ctrlB and F_ctrlC according to an input clock CLK_in such that the frequency of the input clock CLK_in may be changed when the multiplication determination signal M_GDEN is enabled. The multiplication control block also fixes the first to third frequency control signals F_ctrlA, F_ctrlB and F_ctrlC to specified levels regardless of the input clock CLK_in when the multiplication determination signal M_GDEN is disabled. The multiplication control block 100 may fix voltage levels of the plurality of frequency control signals F_ctrlA, F_ctrlB and F_ctrlC when the multiplication determination signal M_GDEN is disabled. The multiplication control block 100 may transition voltage levels of the plurality of frequency control signals F_ctrlA, F_ctrlB and F_ctrlC in each preset cycle of the input clock CLK_in when the multiplication determination signal M_GDEN is enabled.

The clock output block 200 outputs the input clock CLK_in as an output clock CLK_out or outputs the output clock CLK_out by changing the frequency of the input clock CLK_in according to the multiplication determination signal M_GDEN and the first to third frequency control signals F_ctrlA, F_ctrlB and F_ctrlC. For example, the clock output block 200 outputs the input clock CLK_in as the output clock CLK_out when the multiplication determination signal M_GDEN is disabled. The clock output block 200 generates and outputs the output clock CLK_out which has a frequency lower than the frequency of the input clock CLK_in according to the input clock CLK_in and the first to third frequency control signals F_ctrlA, F_ctrlB and F_ctrlC when the multiplication determination signal M_GDEN is enabled. The clock output block 200 generates the output clock CLK_out which transitions each time the input clock CLK_in transitions in response to the plurality of frequency control signals F_ctrlA, F_ctrlB and F_ctrlC and the input clock CLK_in, when the multiplication determination signal M_GDEN is disabled. The clock output block 200 generates the output clock CLK_out which transitions each time the input clock CLK_in passes each preset cycle, in response to the plurality of frequency control signals F_ctrlA, F_ctrlB and F_ctrlC and the input clock CLK_in, when the multiplication determination signal M_GDEN is enabled.

Figure 2:
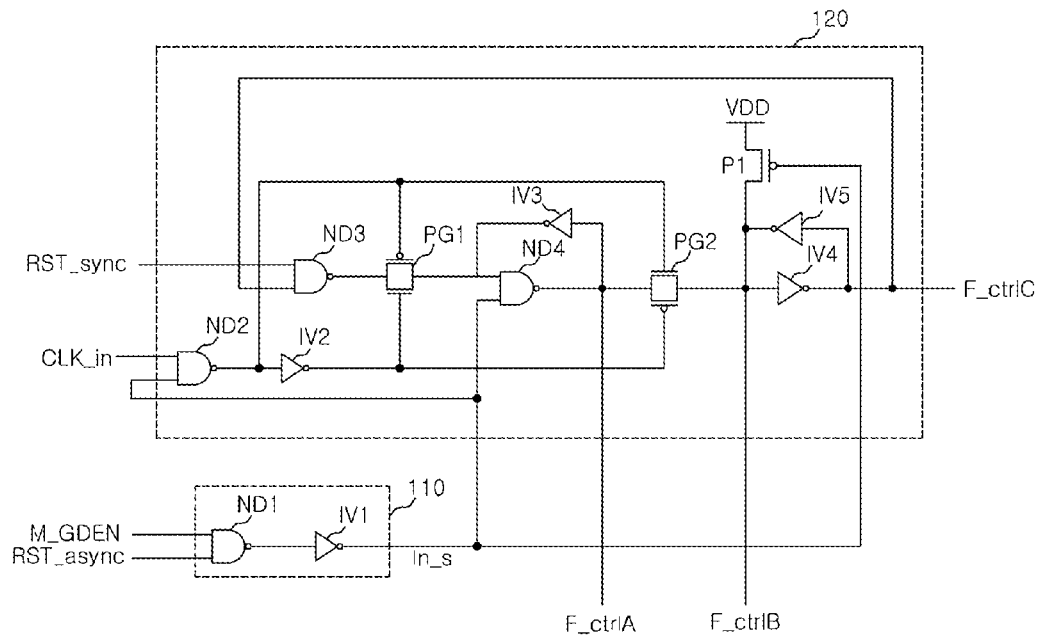
FIG. 2 is a configuration diagram illustrating a representation of an example of the multiplication control block shown in FIG. 1.

Referring to FIG. 2, the multiplication control block 100 includes a latch control unit 110 and a latch unit 120.

The latch control unit 110 generates an initialization signal In_s according to the multiplication determination signal M_GDEN and the asynchronization reset signal RST_async. For example, the latch control unit 110 enables the initialization signal In_s to a low level when the multiplication determination signal M_GDEN is disabled to a low level or the asynchronization reset signal RST_async is enabled to a low level. In addition, the latch control unit 110 disables the initialization signal In_s when the multiplication determination signal M_GDEN is enabled to a high level in the state in which the asynchronization reset signal RST_async is disabled to a high level.

The latch control unit 110 includes a first NAND gate ND1 and a first inverter IV1. The first NAND gate ND1 receives the multiplication determination signal M_GDEN and the asynchronization reset signal RST_async. The first inverter IV1 receives the output signal of the first NAND gate ND1. The first inverter IV1 also outputs the initialization signal In_s.

The latch unit 120 generates the first to third frequency control signals F_ctrlA, F_ctrlB and F_ctrlC according to the input clock CLK_in when the initialization signal In_s is disabled and the synchronization reset signal RST_sync is disabled. For example, the latch unit 120 transitions the respective levels of the first to third frequency control signals F_ctrlA, F_ctrlB and F_ctrlC each time one cycle of the input clock CLK_in passes. Further, the latch unit 120 fixes the first to third frequency control signals F_ctrlA, F_ctrlB and F_ctrlC to respective specified levels when either the initialization signal In_s and the synchronization reset signal RST_sync is enabled. For example, the latch unit 120 enables the first and second frequency control signals F_ctrlA and F_ctrlB to high levels and disables the third frequency control signal F_ctrlC to a low level when one of the initialization signal In_s and the synchronization reset signal RST_sync is enabled.

The latch unit 120 includes second to fourth NAND gates ND2, ND3 and ND4, second to fifth inverters IV2, IV3, IV4 and IV5, first and second pass gates PG1 and PG2, and a transistor P1. The second NAND gate ND2 receives the input clock CLK_in and the initialization signal In_s. The second inverter IV2 receives the output signal of the second NAND gate ND2. The third NAND gate ND3 receives the synchronization reset signal RST_sync and the third frequency control signal F_ctrlC. The first pass gate PG1 receives the output signal of the second NAND gate ND2 through a first control terminal. The first pass gate PG1 also receives the output signal of the second inverter IV2 through a second control terminal. In addition, the first pass gate PG1 also receives the output signal of the third NAND gate ND3 through an input terminal. The fourth NAND gate ND4 receives the output signal of the first pass gate PG1 and the initialization signal In_s. The third inverter IV3 receives the output signal of the fourth NAND gate ND4. The third inverter IV3 also and outputs an input signal to the fourth NAND gate ND4. The output signal of the fourth NAND gate ND4 is the first frequency control signal F_ctrlA. The second pass gate PG2 receives the output signal of the second inverter IV2 through a first control terminal. The second pass gate PG2 also receives the output signal of the second NAND gate ND2 through a second control terminal. In addition, the second pass gate PG2 also receives the output signal of the fourth NAND gate ND4 through an input terminal. The fourth inverter IV4 receives the output signal of the second pass gate PG2. The fourth inverter IV4 also outputs the third frequency control signal F_ctrlC. The fifth inverter IV5 receives the output signal of the fourth inverter IV4. The fifth inverter IV5 also outputs an input signal to the fourth inverter IV4. The second frequency control signal F_ctrlB is outputted from a node with which the second pass gate PG2 and the fourth inverter IV4 are electrically coupled. The transistor P1 has a gate which receives the initialization signal In_s. The transistor P1 also has a drain which is applied with an external voltage VDD. Further, the transistor P1 also has a source with which the node electrically coupled with the fourth and fifth inverters IV4 and IV5 is electrically coupled.

Figure 3:
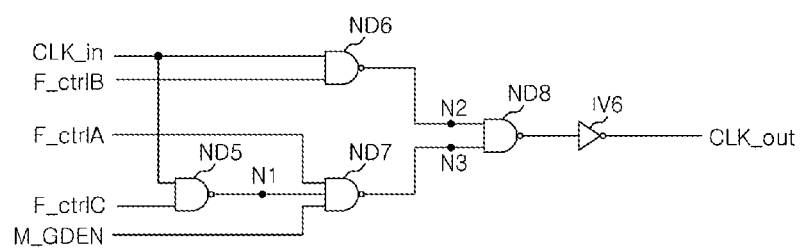
FIG. 3 is a configuration diagram illustrating a representation of an example of the clock output block shown in FIG. 1.

Referring to FIG. 3, the clock output block 200 includes fifth to eighth NAND gates ND5, ND6, ND7 and ND8 and a sixth inverter IV6. The fifth NAND gate ND5 receives the input clock CLK_in and the third frequency control signal F_ctrlC. The sixth NAND gate ND6 receives the input clock CLK_in and the second frequency control signal F_ctrlB. The seventh NAND gate ND7 receives the first frequency control signal F_ctrlA. The seventh NAND gate ND7 also receives the output signal of the fifth NAND gate ND5, and the multiplication determination signal M_GDEN. The eighth NAND gate ND8 receives the output signals of the sixth and seventh NAND gates ND6 and ND7. The sixth inverter IV6 receives the output signal of the eighth NAND gate ND8. The sixth inverter IV6 also outputs the output clock CLK_out. A node with which the fifth NAND gate ND5 and the seventh NAND gate ND7 are electrically coupled is referred to as a first node N1. In addition, a node with which the sixth NAND gate ND6 and the eighth NAND gate ND8 are electrically coupled is referred to as a second node N2. Further, a node with which the seventh NAND gate ND7 and the eighth NAND gate ND8 are electrically coupled is referred to as a third node N3.

Operations of the semiconductor apparatus in accordance with an embodiment, configured as mentioned above, will be described below.

The semiconductor apparatus in accordance with an embodiment is configured to output the output clock CLK_out having the same frequency as the input clock CLK_in. In the alternative, the semiconductor apparatus is configured to output the output clock CLK_out having a frequency lower than the frequency of the input clock CLK_in. For example, the semiconductor apparatus in accordance with an embodiment shown in FIGS. 1 to 3 has a configuration capable of generating the output clock CLK_out having a frequency corresponding to ½ of the frequency of the input clock CLK_in.

First, descriptions will be made for operations in which the semiconductor apparatus in accordance with an embodiment generates the output clock CLK_out having the same frequency as the input clock CLK_in.

Referring again to FIG. 2, if the multiplication determination signal M_GDEN is disabled to the low level, the first frequency control signal F_ctrlA is fixed to the high level. Further, the second frequency control signal F_ctrlB is fixed to the high level. In addition, the third frequency control signal F_ctrlC is fixed to the low level.

Referring once more to FIG. 3, if the multiplication determination signal M_GDEN is disabled to the low level, the third node N3 is fixed to a high level. Moreover, since the second frequency control signal F_ctrlB is fixed to the high level, the input clock CLK_in is outputted as the output clock CLK_out through the sixth NAND gate ND6, the second node N2, the eighth NAND gate ND8 and the sixth inverter IV6.

More specifically, if the multiplication determination signal M_GDEN is disabled, the multiplication control block 100 fixes the respective first to third frequency control signals F_ctrlA, F_ctrlB and F_ctrlC to specified levels. Further, the clock output block 200 receives the first to third frequency control signals F_ctrlA, F_ctrlB and F_ctrlC of the fixed levels. In addition, the clock output block 200 outputs the output clock CLK_out of the same frequency as the input clock CLK_in.

Next, descriptions will be made for operations in which the semiconductor apparatus in accordance with an embodiment generates the output clock CLK_out having a frequency lower than (for example, corresponding to ½ of the frequency of) the input clock CLK_in.

When the multiplication determination signal M_GDEN is enabled to the high level, the multiplication control block 100 generates the first to third frequency control signals F_ctrlA, F_ctrlB and F_ctrlC which transition in their levels each time the input clock CLK_in transitions to a specified level.

The respective first to third frequency control signals F_ctrlA, F_ctrlB and F_ctrlC transition in their levels from values (specified levels) initialized by the multiplication determination signal M_GDEN, the synchronization reset signal RST_sync and the asynchronization reset signal RST_async, each time the input clock CLK_in transitions to a high level.

For example, while being fixed to the high level, the first frequency control signal F_ctrlA transitions to a different level each time the input clock CLK_in transitions to the high level. While being fixed to the high level, the second frequency control signal F_ctrlB transitions to a different level each time the input clock CLK_in transitions to a low level. While being fixed to the low level, the third frequency control signal F_ctrlC transitions to a different level each time the input clock CLK_in transitions to the low level. Since the second frequency control signal F_ctrlB is inverted and is outputted as the third frequency control signal F_ctrlC, it may be mentioned that the third frequency control signal F_ctrlC also transitions to a different level each time the input clock CLK_in transitions to the low level.

Figure 4:
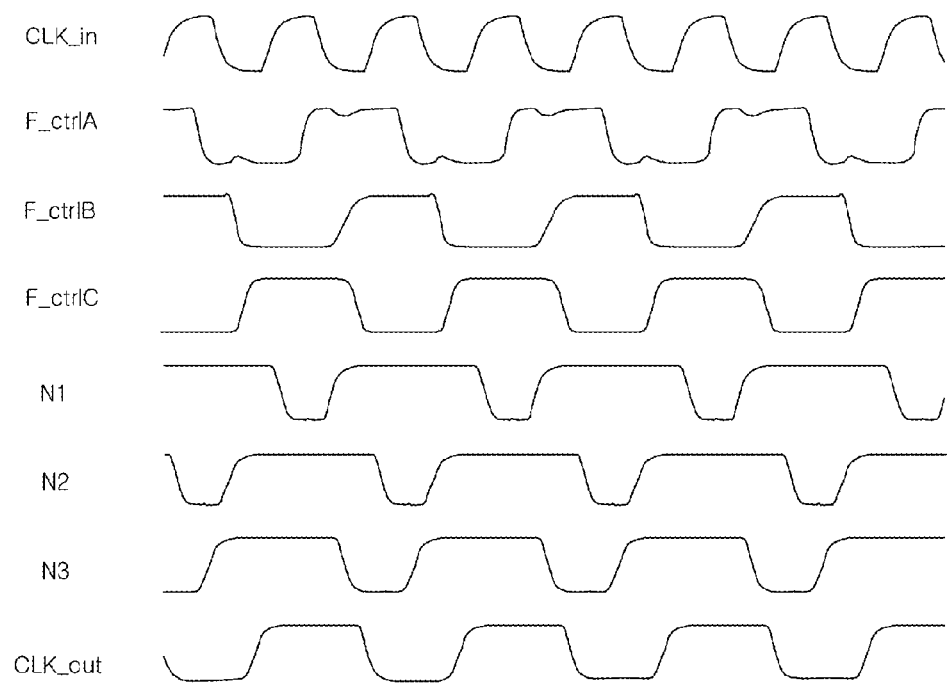
FIG. 4 is a representation of an example of a timing diagram to assist in the explanation of the operations of the semiconductor apparatus in accordance with an embodiment.

Referring to FIG. 4, a representation of an example of a timing diagram to assist in the explanation of the operations of the semiconductor apparatus in accordance with an embodiment is shown. FIG. 4 is a timing diagram that is obtained by calculating even the delay times of the elements shown in FIGS. 2 and 3 (NAND gates, inverters, pass gates, and so forth).

In FIG. 4, the input clock CLK_in is inputted to the multiplication control block 100. The multiplication determination signal M_GDEN is in the state in which it is enabled to the high level. In addition, the asynchronization reset signal RST_async and the synchronization reset signal RST_sync are in the state in which they are disabled. Therefore, the initialization signal In_s is in the state in which it is disabled to the high level.

Referring again to FIG. 2, the multiplication control block 100 transitions the levels of the first to third frequency control signals F_ctrlA, F_ctrlB and F_ctrlC each time one cycle of the input clock CLK_in passes.

In detail, the first pass gate PG1 is turned on each time the input clock CLK_in transitions to the high level. Further, the first pass gate PG1 transfers the output signal of the third NAND gate ND3 to the fourth NAND gate ND4. The fourth NAND gate ND4 outputs the first frequency control signal F_ctrlA. Therefore, the first frequency control signal F_ctrlA is outputted as a signal which transitions each time the input clock CLK_in transitions to the high level as shown in FIG. 4.

The second pass gate PG2 is turned on each time the input clock CLK_in transitions to the low level. Further, the second pass gate PG2 transfers the first frequency control signal F_ctrlA to the fourth inverter IV4. The output signal of the second pass gate PG2 is the second frequency control signal F_ctrlB. Therefore, the second frequency control signal F_ctrlB is outputted as a signal which transitions each time the input clock CLK_in transitions to the low level, as shown in FIG. 4.

Since the third frequency control signal F_ctrlC is the output signal of the fourth inverter IV4, the third frequency control signal F_ctrlC is outputted as a signal which has a phase opposite to the phase of the second frequency control signal F_ctrlB, as shown in FIG. 4.

The third frequency control signal F_ctrlC is inputted as the input signal of the third NAND gate ND3. The third frequency control signal F_ctrlC is also inputted as the input signal of the fourth NAND gate ND4 when the input clock CLK_in transitions to the high level.

Since the third frequency control signal F_ctrlC is fed back and determines the levels of the first to third frequency control signals F_ctrlA, F_ctrlB and F_ctrlC according to the level transition of the input clock CLK_in, the first to third frequency control signals F_ctrlA, F_ctrlB and F_ctrlC are outputted as signals which cyclically transition accordingly.

The first to third frequency control signals F_ctrlA, F_ctrlB and F_ctrlC generated in this way, the input clock CLK_in and the multiplication determination signal M_GDEN are inputted to the clock output block 200 of FIG. 3.

The fifth NAND gate ND5 receives the input clock CLK_in and the third frequency control signal F_ctrlC. The fifth NANG gate ND5 also determines the voltage level of the first node N1. Therefore, the voltage level of the first node N1 transitions to a low level only when both the input clock CLK_in and the third frequency control signal F_ctrlC are high levels as illustrated in FIG. 4. The voltage level of the first node N1 transitions to a high level when even one of the input clock CLK_in and the third frequency control signal F_ctrlC is a low level.

The sixth NAND gate ND6 receives the input clock CLK_in and the second frequency control signal F_ctrlB. The sixth NAND gate ND6 also determines the voltage level of the second node N2. Therefore, the voltage level of the second node N2 transitions to a low level only when both the input clock CLK_in and the second frequency control signal F_ctrlB are high levels as shown in FIG. 4. The voltage level of the second node N2 transitions to a high level when even one of the input clock CLK_in and the second frequency control signal F_ctrlB is a low level.

The seventh NAND gate ND7 receives the first frequency control signal F_ctrlA, the multiplication determination signal M_GDEN and the output signal of the fifth NAND gate ND5. Further, the seventh NAND gate ND7 determines the voltage level of the third node N3. Since the multiplication determination signal M_GDEN is in the state in which it is enabled to the high level, the voltage level of the third node N3 is determined according to the first frequency control signal F_ctrlA and the output signal of the fifth NAND gate ND5, or more specifically, the voltage level of the first node N1. Therefore, the voltage level of the third node N3 transitions to a low level only when the first frequency control signal F_ctrlA and the voltage level of the first node N1 are high levels as illustrated in FIG. 4. The voltage level of the third node N3 transitions to a high level only when one of the voltage levels of the first node N1 and the first frequency control signal F_ctrlA is a low level.

The eighth NAND gate ND8 and the sixth inverter IV6 determine the voltage level of the output clock CLK_out according to the voltage level of the second node N2 and the third node N3. Therefore, the output clock CLK_out transitions to a high level only when both the second and third nodes N2 and N3 are high levels as shown in FIG. 4. The output clock CLK_out transitions to a low level only when one of the second and third nodes N2 and N3 is a low level.

The output clock CLK_out transitions to the high level when the second and third nodes N2 and N3 are the high levels. The voltage level of the second node N2 transitions to the low level when both the input clock CLK_in and the second frequency control signal F_ctrlB are the high levels. In addition, the voltage level of the third node N3 transitions to the low level when all the input clock CLK_in and the first and third frequency control signals F_ctrlA and F_ctrlC are the high levels.

Accordingly, the output clock CLK_out transitions by the combination of the first to third frequency control signals F_ctrlA, F_ctrlB and F_ctrlC when the input clock CLK_in transitions to the high level. Therefore, a timing (or a rising timing) at which the output clock CLK_out transitions to the high level is determined by a timing (or a rising timing) at which the input clock CLK_in transitions to the high level accordingly.

As the semiconductor apparatus in accordance with an embodiment is configured to operate such that, in the case of generating the output clock CLK_out having the same frequency as the input clock CLK_in, the voltage level of the third node N3 is fixed by the fixed levels of the first to third frequency control signals F_ctrlA, F_ctrlB and F_ctrlC. Further, when the voltage level of the input clock CLK_in transitions, the voltage level of the second node N2 transitions and thus the voltage level of the output clock CLK_out transitions, it is possible to generate the output clock CLK_out of the same frequency as the input clock CLK_in. In addition, the semiconductor apparatus in accordance with an embodiment is configured to operate, in the case of generating the output clock CLK_out of a frequency lower than the frequency of the input clock CLK_in, the voltage levels of the second and third nodes N2 and N3 are determined according to the input clock CLK_in and the first to third frequency control signals F_ctrlA, F_ctrlB and F_ctrlC of which voltage levels are changed in each preset cycle of the input clock CLK_in. Further, the output clock CLK_out is generated according to the voltage levels of the second and third nodes N2 and N3. As a result, the output clock CLK_out is outputted through the eighth NAND gate ND8 and the sixth inverter IV6 according to the voltage levels of the second and third nodes N2 and N3.

As a consequence, in the semiconductor apparatus in accordance with an embodiment, the path N2, N3, ND8 and IV6, through which the output clock is generated, in the case of generating the output clock of the same frequency as the input clock, and the path N2, N3, ND8 and IV6, through which the output clock is generated, in the case of generating the output clock of a frequency lower than the input clock, are the same. Accordingly, in the semiconductor apparatus in accordance with an embodiment, in the case of generating the output clock of the same frequency as the input clock and in the case of generating the output clock of a frequency lower than the input clock, it is possible to eliminate the phase difference between the output clocks before and after frequency change.

Figure 5:
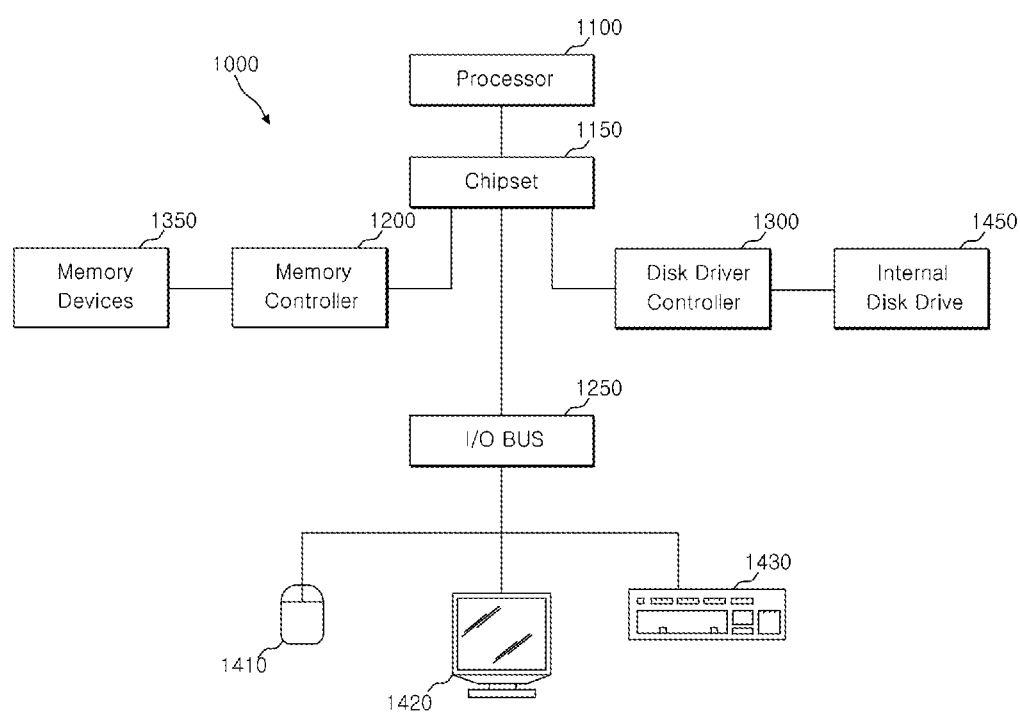
FIG. 5 illustrates a block diagram of a system employing a memory controller circuit in accordance with an embodiment of the invention.

Referring to FIG. 5, a system 1000 may include one or more processors 1100. The processor 110 maybe used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided form the processor 1100 through the chipset 1150. The memory controller 1200 may be electrically coupled to one or more memory devices 1350. The memory devices 1350 may include the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol, including all of those mentioned above with regard to the I/O bus 1250.

While various embodiments have been described above, it will be understood to those skilled in the art that the embodiments described are by way of examples only. Accordingly, the semiconductor apparatus described should not be limited based on the described embodiments above.

What is claimed is:

1. A semiconductor apparatus comprising:
    a multiplication control block configured to generate a plurality of frequency control signals according to an input clock and a multiplication determination signal; and
    a clock output block configured to generate an output clock according to the input clock, the multiplication determination signal and the plurality of frequency control signals, wherein the multiplication control block fixes voltage levels of the plurality of respective frequency control signals according to the multiplication determination signal, or transitions the voltage levels of the plurality of frequency control signals in each preset cycle of the input clock.

2. The semiconductor apparatus according to claim 1, wherein the multiplication control block fixes voltage levels of the plurality of respective frequency control signals when the multiplication determination signal is disabled, and transitions the voltage levels of the plurality of frequency control signals in each preset cycle of the input clock when the multiplication determination signal is enabled.

3. The semiconductor apparatus according to claim 1, wherein the clock output block generates the output clock which has the same frequency as the input clock when the multiplication determination signal is disabled, and generates the output clock which has a frequency lower than the input clock when the multiplication determination signal is enabled.

4. The semiconductor apparatus according to claim 1,
wherein the clock output block generates the output clock which transitions each time the input clock transitions, in response to the plurality of frequency control signals and the input clock when the multiplication determination signal is disabled, and
wherein the clock output block generates the output clock which transitions each time the input clock passes each preset cycle, in response to the plurality of frequency control signals and the input clock when the multiplication determination signal is enabled.

5. The semiconductor apparatus according to claim 1,
wherein the plurality of frequency control signals include a first frequency control signal, a second frequency control signal, and a third frequency control signal, and
wherein the clock output block comprises:
a first logic element configured to logically combine a voltage level of the input clock and a voltage level of the third frequency control signal, and determine a voltage level of a first node;
a second logic element configured to logically combine a voltage level of the input clock and a voltage level of the second frequency control signal, and determine a voltage level of a second node;
a third logic element configured to logically combine a voltage level of the multiplication determination signal, a voltage level of the first frequency control signal and the voltage level of the first node, and determine a voltage level of a third node; and
a fourth logic element configured to output the output clock according to the voltage levels of the second and third nodes.

6. The semiconductor apparatus according to claim 5, wherein each of the first to third logic elements comprises a NAND gate which outputs a low level when respective inputs are all high levels.

7. The semiconductor apparatus according to claim 5, wherein the fourth logic element comprises a NAND gate and an inverter electrically coupled in series that perform a multiplication to transition the output clock to a high level when both the voltage levels of the second and third nodes are high levels.

8. A semiconductor apparatus comprising:
a multiplication control block configured to generate first to third frequency control signals according to a multiplication determination signal and initialize the first to third frequency control signals according to a synchronization reset signal and an asynchronization reset signal; and
a clock output block configured to output an output clock according to the multiplication determination signal and the first to third frequency control signals,
wherein the multiplication control block includes a latch control unit configured to generate an initialization signal according to the multiplication determination signal and the asynchronization reset signal.

9. The semiconductor apparatus according to claim 8, wherein the latch control unit is configured to disable the initialization signal when the multiplication determination signal and the asynchronization reset signal are at a high level.

10. The semiconductor apparatus according to claim 8, wherein the multiplication control block further comprising:
a latch unit configured to generate the first to third frequency control signals according to an input clock when an initialization signal and the synchronization reset signal are disabled.

11. The semiconductor apparatus according to claim 10, wherein the latch unit is configured to fix the first to third frequency control signals to specified levels when one of the initialization signal and the synchronization reset signal is enabled.

12. The semiconductor apparatus according to claim 8, wherein when the multiplication determination signal is at a low level, the first frequency control signal and the second frequency control signal are at a high level, and the third frequency control signal is at the low level.

13. The semiconductor apparatus comprising:
a multiplication control block configured to generate first to third frequency control signals according to an input clock to allow a frequency of the input clock to be changed when a multiplication determination signal is enabled and fix the first to third frequency control signals to specified levels when the multiplication determination signal is disabled; and
a clock output block configured to output an output clock by changing the frequency of the input clock according to the multiplication determination signal and the first to third frequency control signals,
wherein the multiplication control block includes a latch control unit configured to generate an initialization signal according to the multiplication determination signal and the asynchronization reset signal.

14. The semiconductor apparatus according to claim 13, wherein the multiplication block is configured to enable an initialization signal to a low level when multiplication determination signal and an asynchronization reset signal are at the low level.

15. The semiconductor apparatus according to claim 13, wherein the multiplication block is configured to transition the levels of the first to third frequency control signals in response to one cycle of the input clock.

16. The semiconductor apparatus according to claim 15, wherein the multiplication block is configured to fix the first to third frequency control signals to the specified levels when an initialization signal or a synchronization reset signal is enabled.

17. The semiconductor apparatus according to claim 13, wherein when the multiplication determination signal is disabled, the clock output block is configured to receive the first to third frequency control signals and output the output clock at a frequency identical to the input clock.

18. The semiconductor apparatus according to claim 13, wherein the first to third frequency control signals transition in their levels in response to the input clock transitioning to a high level.

* * * * *